United States Patent
Cong et al.

(10) Patent No.: US 12,497,697 B2
(45) Date of Patent: Dec. 16, 2025

(54) LAYER WITH DISCRETE ISLANDS FORMED ON A SUBSTRATE SUPPORT

(71) Applicant: Applied Materials, Inc., Santa Clara, CA (US)

(72) Inventors: Zhepeng Cong, San Jose, CA (US); Nyi Oo Myo, San Jose, CA (US); Hui Chen, Tempe, AZ (US); Huy D. Nguyen, San Ramon, CA (US); Shaofeng Chen, Austin, TX (US); Xinning Luan, Tempe, AZ (US); Kirk Allen Fisher, Tempe, AZ (US); Aimee S. Erhardt, Tempe, AZ (US); Shawn Joseph Bonham, Mesa, AZ (US); Philip Michael Amos, Apache Junction, AZ (US); James M. Amos, Apache Junction, AZ (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 17/450,418

(22) Filed: Oct. 8, 2021

(65) Prior Publication Data
US 2023/0114751 A1 Apr. 13, 2023

(51) Int. Cl.
*C23C 16/458* (2006.01)
*H01L 21/687* (2006.01)
(Continued)

(52) U.S. Cl.
CPC .... *C23C 16/4581* (2013.01); *H01L 21/68742* (2013.01); *H01L 21/68785* (2013.01);
(Continued)

(58) Field of Classification Search
CPC ............... F27D 5/0037; H01L 21/6875; H01L 21/68785; H01L 21/673; H01L 21/683;
(Continued)

(56) References Cited

U.S. PATENT DOCUMENTS 6,077,357 A * 6/2000 Rossman ............ H01L 21/6833
 118/728
6,086,680 A * 7/2000 Foster ............... H01L 21/68785
 118/728
(Continued)

FOREIGN PATENT DOCUMENTS

JP H07058041 A 3/1995
JP 2009272646 A 11/2009
(Continued)

OTHER PUBLICATIONS

Collins "Define: In", Webster's New College Dictionary, Houghton Mifflin, 2010, p. 12. (Year: 2010).*

(Continued)

*Primary Examiner* — Karl Kurple
(74) *Attorney, Agent, or Firm* — Patterson + Sheridan, LLP

(57) ABSTRACT

A substrate support assembly and processing chamber having the same are disclosed herein. In one embodiment, a substrate support assembly is provided that includes a body. The body has a center, an outer perimeter connecting a substrate support surface and a backside surface. The body additionally has a pocket disposed on the substrate support surface at the center and a lip disposed between the pocket and the outer perimeter. A layer is formed in the pocket of the substrate support surface. A plurality of discrete islands are disposed in the layer, wherein the discrete islands are disposed about a center line extending perpendicular from the substrate support surface.

12 Claims, 6 Drawing Sheets

(51) Int. Cl.
  *C30B 25/12* (2006.01)
  *F27B 17/00* (2006.01)
  *F27D 5/00* (2006.01)
(52) U.S. Cl.
  CPC .......... *C23C 16/4585* (2013.01); *C30B 25/12* (2013.01); *F27B 17/0025* (2013.01); *F27D 5/0037* (2013.01)
(58) Field of Classification Search
  CPC ..... H01L 21/687; C23C 16/458; C30B 25/12; C30B 31/14
  See application file for complete search history.

(56) References Cited

U.S. PATENT DOCUMENTS

| | | | |
|---|---|---|---|
| 6,264,467 B1* | 7/2001 | Lue | C30B 31/14 211/41.18 |
| 6,946,403 B2* | 9/2005 | Kellerman | H01L 21/6833 438/758 |
| 7,072,165 B2* | 7/2006 | Kellerman | H01L 21/6875 361/233 |
| 7,824,498 B2 | 11/2010 | Parkhe et al. | |
| 2004/0131775 A1* | 7/2004 | Blaedel | H01L 21/02 427/255.6 |
| 2005/0041364 A1* | 2/2005 | Kellerman | H01L 21/6875 361/234 |
| 2007/0128570 A1* | 6/2007 | Goto | F27D 5/0037 432/253 |
| 2010/0096262 A1* | 4/2010 | Aruga | H01L 21/6833 204/298.08 |
| 2011/0049779 A1* | 3/2011 | Egami | H01L 21/68771 29/559 |
| 2013/0037532 A1 | 2/2013 | Volfovski et al. | |
| 2015/0240357 A1* | 8/2015 | Tachibana | C23C 16/4586 118/725 |
| 2018/0301364 A1 | 10/2018 | Boyd, Jr. et al. | |
| 2018/0330926 A1* | 11/2018 | Boyd, Jr. | H01L 21/6833 |
| 2018/0366352 A1* | 12/2018 | Müller | F27D 5/0037 |
| 2019/0291214 A1* | 9/2019 | Peng | H01J 37/32495 |
| 2020/0234932 A1 | 7/2020 | Parimi et al. | |
| 2020/0243368 A1 | 7/2020 | Boyd, Jr. et al. | |
| 2020/0273741 A1* | 8/2020 | Liao | H01L 21/68757 |
| 2021/0111059 A1 | 4/2021 | Ulavi et al. | |
| 2023/0369095 A1* | 11/2023 | Zinner | H01L 21/185 |

FOREIGN PATENT DOCUMENTS

| | | |
|---|---|---|
| JP | 201016176 A | 1/2010 |
| JP | 2010147080 A | 7/2010 |
| JP | 2014524664 A | 9/2014 |
| JP | 2015065327 A | 4/2015 |
| JP | 2017199745 A | 11/2017 |
| JP | 2018536287 A | 12/2018 |
| JP | 6612985 B2 | 11/2019 |

OTHER PUBLICATIONS

International Search Report and Written Opinion for PCT/US2022/035223 dated Oct. 26, 2022.
Japanese Office Action for Application No. 2024-519990 dated Mar. 11, 2025.
Korean Office Action for Application No. 10-2024-7014306 dated Feb. 4, 2025.
Taiwan Office Action for Application No. 111126851 dated Sep. 19, 2025.

* cited by examiner

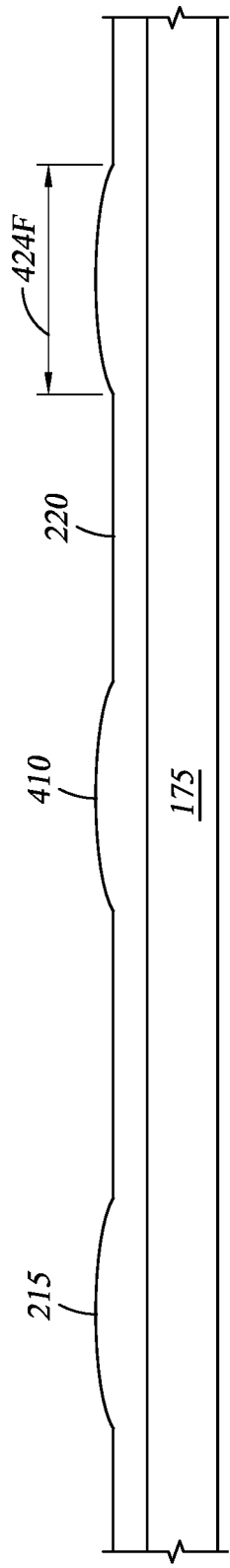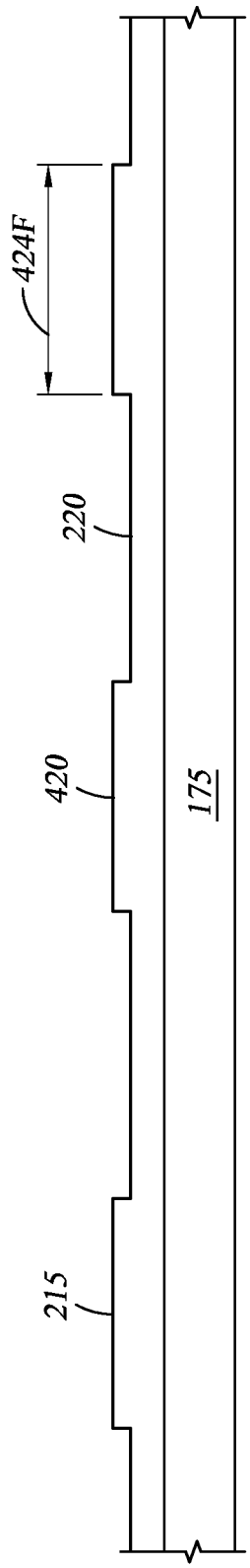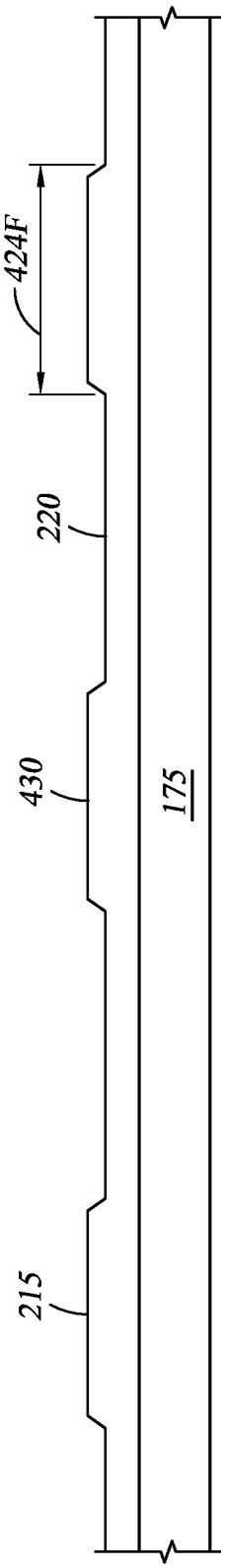

LAYER WITH DISCRETE ISLANDS FORMED ON A SUBSTRATE SUPPORT

FIELD

Embodiments disclosed herein generally relate to substrate supports; more specifically, embodiments disclosed herein generally relate to a pattern of discrete islands on a substrate support surface.

BACKGROUND

Substrate supports are widely used to hold substrates, such as semiconductor substrates, during substrate processing in processing chambers used for various applications, such as physical vapor deposition (PVD), etching, or chemical vapor deposition. Substrate supports typically include one or more heaters embedded within a unitary chuck body. The chuck body may be formed from a thermally conductive material such as a ceramic material, carbon based material, or other suitable material.

A substrate is disposed on the top surface of the substrate support for processing in the processing chamber. The top surface of the substrate support may have a number of mesas or other features to elevate the substrate above the top surface of the substrate support. The mesas reduce the thermal contact which improves the temperature uniformity when processing the substrate. However, forming smaller mesas on the substrate support by machining can cause surface stress on the substrate support and even warpage of the substrate support.

Thus, there is a need for an improved substrate support.

SUMMARY

A substrate support assembly and processing chamber having the same are disclosed herein. In one embodiment, a substrate support assembly is provided that includes a body. The body has a center, an outer perimeter connecting a substrate support surface and a backside surface. The body additionally has a pocket disposed on the substrate support surface at the center and a lip disposed between the pocket and the outer perimeter. A layer is formed in the pocket of the substrate support surface. A plurality of discrete islands are disposed in the layer, wherein the discrete islands are disposed about a center line extending perpendicular from the substrate support surface.

In another embodiment, a processing chamber is provided that includes a substrate support assembly disposed in a processing volume of the processing chamber. The substrate support assembly includes a body. The body has a center, an outer perimeter connecting a substrate support surface and a backside surface. The body additionally has a pocket disposed on the substrate support surface at the center and a lip disposed between the pocket and the outer perimeter. A layer is formed in the pocket of the substrate support surface. A plurality of discrete islands are disposed in the layer, wherein the discrete islands are disposed about a center line extending perpendicular from the substrate support surface.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 4A-4C illustrate a partial cross sectional view of the substrate support detailing a plurality of profiles for the discrete islands.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

As described herein a substrate support is provided having a plurality of discrete islands formed thereon. The layout and size of the discrete islands is achieved economically while reducing warpage and stress on the substrate support. The new approach for forming the discrete islands remove the need for machining and reduced the stress generated by the machined surface. The new approach removes the need for machining and reduced the stress generated by the machined surface. Although the substrate support is illustrated and described with respect to an epitaxial processing chamber, it should be appreciated that the disclosed approach and support may be used in other processing chambers and types of substrate support. For example, one substrate support that may benefit from this disclosure may be an electrostatic chuck.

Figure 1:
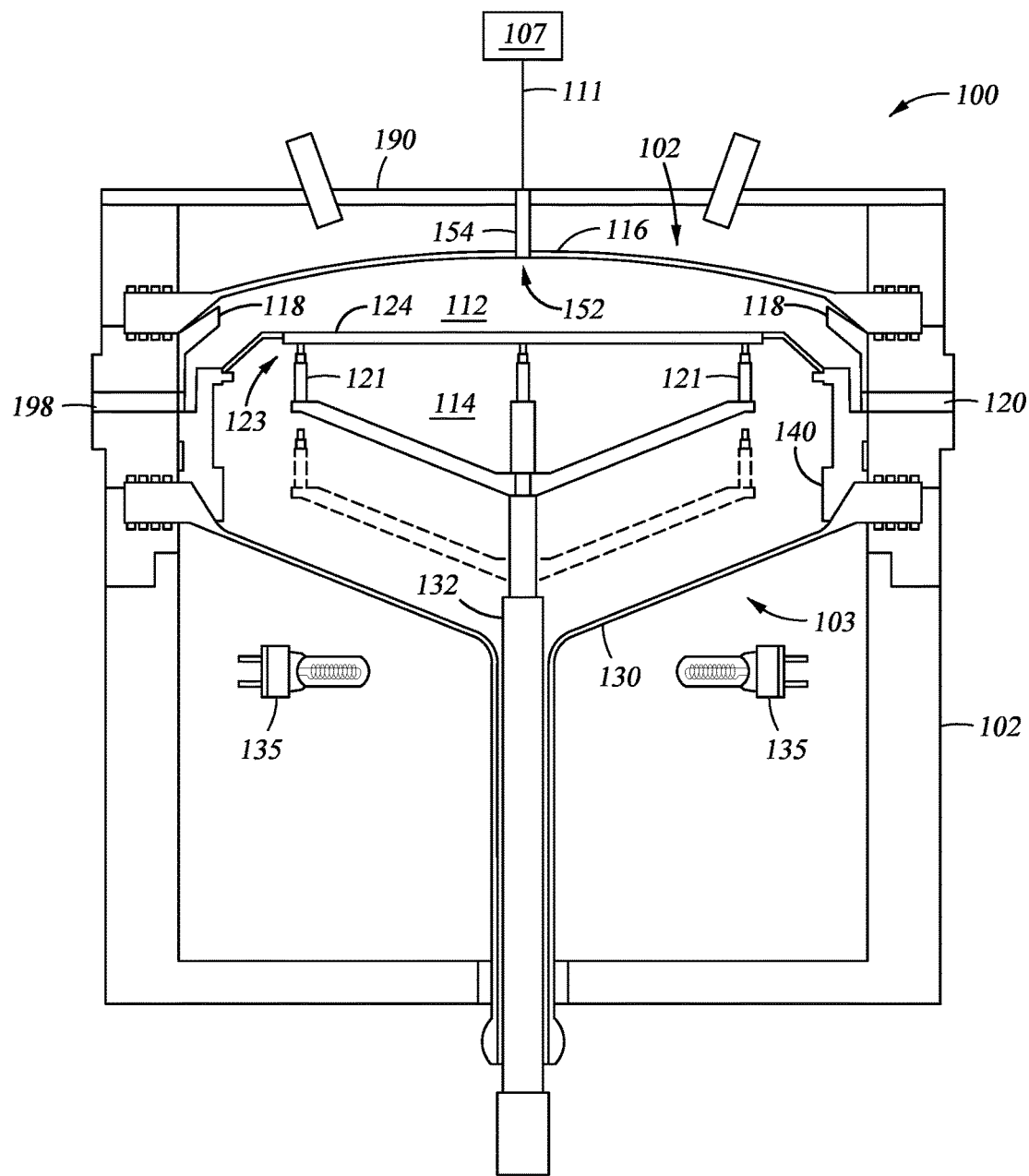
FIG. 1 is a schematic sectional side view of a processing chamber within which an exemplary substrate support may be operated.

FIG. 1 schematically illustrates a sectional view of one embodiment of an epitaxy process chamber 100 in accordance with embodiments of the present invention. In one embodiment, an epitaxy processing chamber 100 that may be adapted to benefit from the invention is an EPI CENTURA® near atmospheric chemical vapor deposition (CVD) System, available from Applied Materials, Inc., of Santa Clara, Calif. The epitaxy processing chamber 100 presented herein shown in schematic is one embodiment and is not intended to be limiting of all possible embodiments. It is envisioned that other substrate processing chambers can be used in accordance with embodiments described herein, including chambers from other manufacturers.

The epitaxy chamber 100 comprises a chamber body 101, support system 104, and a chamber controller 106. The chamber body 101 includes the upper reflector module 102 and the lower lamp module 103. The upper reflector module 102 includes the area within the chamber body 101 between a ceiling 116 and a substrate support assembly 132 disposed within the chamber body 101. The ceiling 116 may be formed from a transparent quartz or other suitable material. In one example, the ceiling 116 may be an upper dome. The epitaxy chamber 100 additionally has an articulating sensor assembly 200. The articulating sensor assembly 200 is coupled to the epitaxy chamber 100. In one example, the articulating sensor assembly 200 is to a mounting plate 190 that is attached to the ceiling 116. The mounting plate 190 may additionally be a reflector. The mounting plate 190 reflects back the energy to the substrate and may have openings only where the articulating sensor assembly 200 needs to have line of sight to the process volume. Alternately, articulating sensor assembly 200 may be attached directly to the ceiling 116.

The lower lamp module 103 includes the area within the chamber body 101 between a lower portion 130 of the chamber body 101 and the substrate support assembly 132. In one example, the lower portion 130 may be a lower dome. Deposition processes generally occur on an upper surface of a substrate 124 supported on the substrate support assembly 132 and exposed to the upper reflector module 102. The substrate 124 is supported by support pins 121 disposed beneath the substrate 124 and extending from the substrate support assembly 132.

An upper liner 118 is disposed within the upper reflector module 102 and is adapted to prevent undesired deposition onto chamber components. The upper liner 118 is positioned adjacent to a ring 123 within the upper reflector module 102.

The epitaxy chamber 100 includes a plurality of heat sources, such as lamps 135, which are adapted to provide thermal energy to components positioned within the epitaxy chamber 100. For example, the lamps 135 may be adapted to provide thermal energy to the substrate 124 and the ring 123. The lower portion 130 may be formed from an optically transparent material, such as quartz, to facilitate the passage of thermal radiation therethrough.

The chamber body 101 also includes an outer inlet port 198 formed through a sidewall of the chamber body 101 and a central inlet port 152 formed on a center region of the upper dome where a center gas line 154 is coupled to. An outer gas line (not shown) and an inner gas line 111 may be coupled to the outer inlet port 198 and the central inlet port 152 respectively to deliver gases supplied from a gas panel module 107. An exhaust port 127 may be coupled to the chamber body 101 to maintain the epitaxy chamber 100 at a desired regulated pressure range as needed. The outer inlet port 198 may be adapted to provide a gas, including doping gas, reacting gas, non-reacting gas, inert gas, or any suitable gas therethrough into the upper reflector module 102 of the chamber body 101. Thermal decomposition of the gas onto the substrate 124 configured to form an epitaxial layer on the substrate 124 is facilitated by the lamps 135.

The substrate support assembly 132 is positioned in the lower lamp module 103 of the chamber body 101. The substrate support assembly 132 is illustrated supporting a substrate 124 in a processing position. The substrate support assembly 132 includes a plurality of support pins 121. The support pins 121 are vertically moveable and are adapted to contact the underside of the substrate 124 to lift the substrate 124 from a processing position (as shown) to a substrate transfer position. The components of the substrate support assembly 132 can be fabricated from quartz, silicon carbide, graphite coated with silicon carbide or other suitable materials.

The ring 123 is removable disposed on a lower liner 140 that is coupled to the chamber body 101. The ring 123 is disposed around the internal volume of the chamber body 101 and circumscribes the substrate 124 while the substrate 124 is in the processing position. The ring 123 can be formed from a thermally-stable material such as silicon carbide, quartz or graphite coated with silicon carbide. The ring 123, in combination with the position of the substrate 124, separates the volume of the upper reflector module 102 from the lower lamp module 103. The ring 123 directs gas flow through the upper reflector module 102 when the substrate 124 is positioned level with the ring 123. The separate volume of the upper reflector module 102 enhances deposition uniformity by controlling the flow of process gas as the process gas is provided to the epitaxy chamber 100.

The support system 104 includes components used to execute and monitor pre-determined processes, such as the growth of epitaxial films in the epitaxy chamber 100. The support system 104 includes one or more of the gas panel modules 107, gas distribution conduits, power supplies, and process control instruments. A chamber controller 106 is coupled to the support system 104 and is adapted to control the epitaxy chamber 100 and support system 104. The chamber controller 106 includes a central processing unit (CPU), a memory, and support circuits. Instructions resident in chamber controller 106 may be executed to control the operation of the epitaxy chamber 100. The epitaxy chamber 100 is adapted to perform one or more film formation or deposition processes therein. For example, a silicon epitaxial growth process may be performed within the epitaxy chamber 100. It is contemplated that other processes may be performed within the epitaxy chamber 100.

During film deposition in the epitaxy chamber 100, the substrate 124 is heated. The substrate 124 is heated by absorbing radiation from the lamps 135. The substrate support assembly 132 and substrate 124 are rotated to minimize temperature non-uniformities resulted from the direct radiation of the lamps 135.

Figure 2:
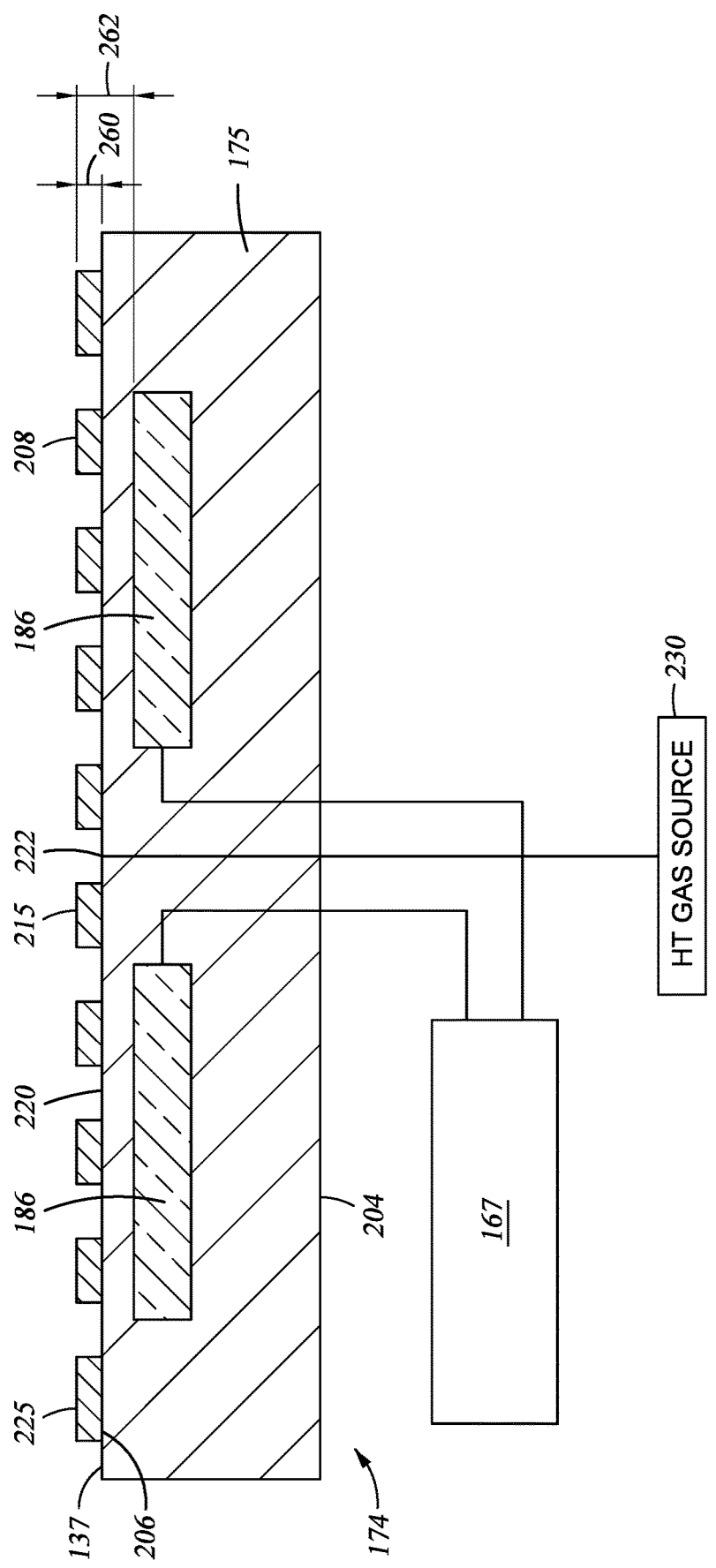
FIG. 2 is a schematic cross-sectional detail view of the substrate support shown in FIG. 1.

The substrate support assembly 132 has a substrate support 174. FIG. 2 illustrates a schematic cross-sectional detail view of the substrate support 174. As shown, the substrate support 174 has a body 175. The body 175 may be fabricated from a material such as graphite and the like. The body 175 has a backside surface 204 and a substrate support surface 137. The substrate support surface 137 is utilized to support the substrate 124.

A plurality of discrete islands 215 are formed on the substrate support surface 137 to minimize the contact area between the substrate 124 and the substrate support 174. The discrete islands 215 may be comprised of one or more separate layers of material deposited on the substrate support surface 137 of the body 175.

The discrete islands 215 may have a top surface 208 and a bottom surface 206. The bottom surface 206 may be disposed directly upon the substrate support surface 137 of the substrate support 174. A thickness 260 of the discrete islands 215 may be preferentially selected and spatially distributed across the substrate support surface 137 to form a pattern and, optionally, an outer peripheral ring 225. The discrete islands 215 are generally configured to support the substrate 124 along the top surface 208 during processing. Troughs 220 are formed between the discrete islands 215. The troughs 220 do not contact the substrate 124 disposed the substrate support surface 137 of the substrate support 174.

Optionally, a heat transfer gas source is coupled through the substrate support 174 to the substrate support surface 137 to provide backside gas to the trough 220 defined between the discrete islands 215. The heat transfer gas source provides a heat transfer gas (i.e., the backside gas) that flows between the backside of the substrate 124 and the substrate support 174 in order to help regulate the rate of heat transfer between the substrate support 174 and the substrate 124. The heat transfer gas may flow from outwards from a center of the substrate support 174 and through the trough 220 around the discrete islands 215 and over the outer peripheral ring 225 into the processing volume 116 (shown in FIG. 1). In one example, the heat transfer gas may comprise an inert gas, such as argon, helium, nitrogen, or a process gas. The heat transfer gas, such as argon, may be a process gas, and wherein a flow rate into the chamber volume is measured to obtain predictable results. The heat transfer gas may be delivered to the trough 220 through one or more inlets 222 in the substrate support 174 that are in fluid communication with one or more trough 220 and the heat transfer gas source. The outer peripheral ring 225 contacts the substrate near its edge and may be preferentially designed to control the amount of heat transfer gas that escapes from between the substrate 124 and the substrate support 174 into the processing volume. For example, the outer peripheral ring 225 and discrete islands 215 may be configured to provide a resistance to flow the transfer gas such that a pressure of the gas present between the substrate 124 and substrate support 174 does not exceed a predetermined value.

The discrete islands 215 may be formed by depositing, 3D printing, laminating, or providing material onto the substrate support surface 137 through other suitable techniques. The formation of the discrete islands 215 is controls both the contact area of the discrete islands 215 and temperature conductance through the troughs 220 defined between the discrete islands 215. The discrete islands 215 may be formed in a pattern across the substrate support surface 137 of the substrate support 174.

Figure 3A:
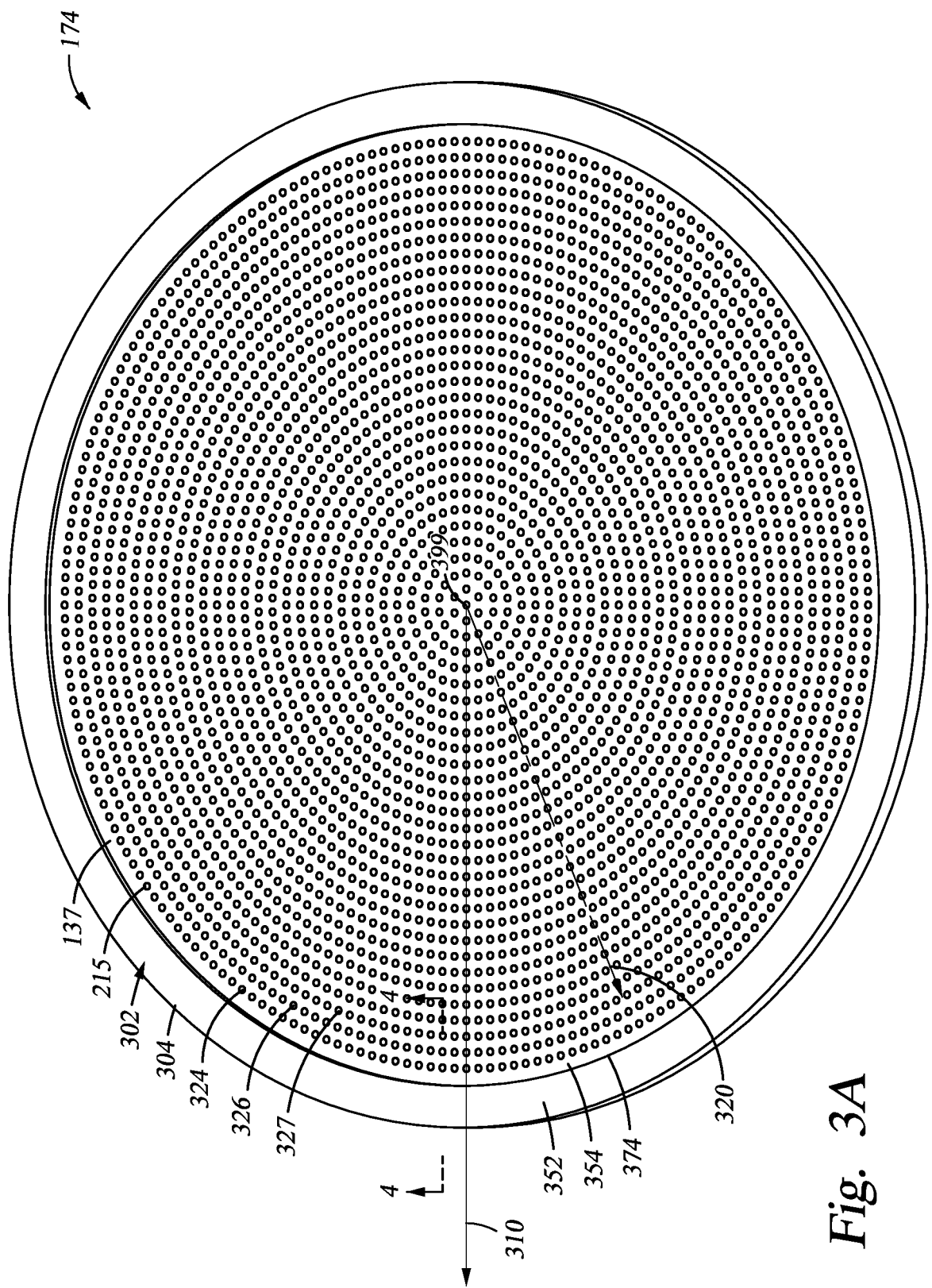
FIG. 3A is a top plan view of a substrate support surface for the substrate support detailing a schematic layout for discrete islands.
Figure 3B:
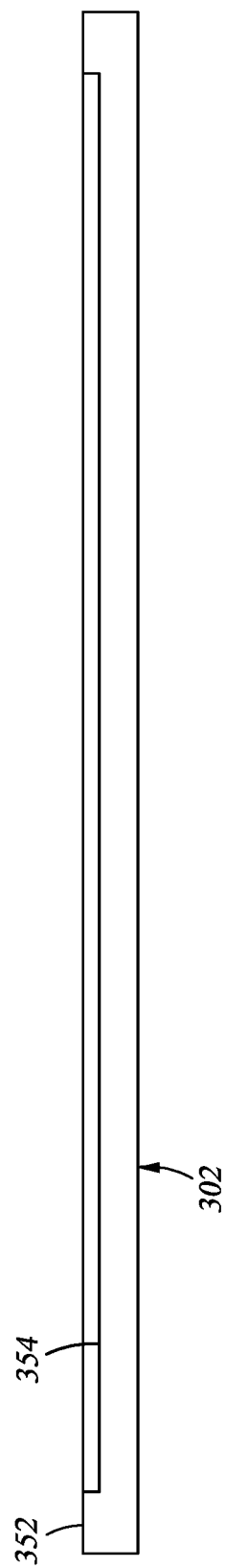
FIG. 3B is a cross-sectional view of the substrate support shown in FIG. 3A.

FIG. 3A is a top plan view of the substrate support surface 137 for the substrate support 174 detailing one example of a schematic layout for the discrete islands 215. FIG. 3B is a cross-sectional view of the substrate support 174 shown in FIG. 3A. The body 175 of the substrate support 174 has an outer perimeter 304. The body 175 has a pocket 354 and a lip 352, both of which are more clearly visible in FIG. 3B. The lip 352 extends from the pocket 354 to the outer perimeter 304 of the body 175. The lip 352 additionally extends away from the backside surface 204 and above the pocket 354.

The discrete islands 215 are disposed in the pocket 354 on the substrate support surface 137. The substrate support surface 137 has a center 399 about which discrete islands 215 are symmetrically disposed. The discrete islands 215 may have a substantially round cross-sectional shape where each discrete island 215 interfaces with the substrate support surface 137. In one example, each discrete island 215 is symmetrical about a center line extending perpendicular from the substrate support surface 137. At least some of the discrete islands 215 may have a diameter at the interface of the discrete island 215 with the substrate support surface 137 of between about 1.5 mm and about 4 mm, such as about 3 mm.

The discrete island 215 may be disposed in concentric rings 320. The discrete islands 215 may alternatively be radial aligned along a radius 310 extending from the center 399. The concentric rings 320 near the center 399 have fewer discrete islands 215 than the concentric rings 320 near an outer periphery 374 of the substrate support 174. However, some adjacent concentric rings 320 may have the same number of discrete islands 215. For example, an outer edge row 324 of the concentric rings 320 of discrete islands 215 along the outer periphery 374 of the substrate support 174 may have the same number of discrete islands 215 as a second row 326 of the concentric rings 320 of discrete islands 215 along the outer periphery 374 of the substrate support 174.

It should be appreciated that the number and pattern of discrete islands 215 disposed on the substrate support surface 137 can vary in shape and quantity. The configuration can be optimized to reduce the contact between the substrate 124 and the substrate support surface 137. As calculated, the conventional machine cut mesa has a contact coverage of around 14% of the substrate area, while the discrete islands of the present disclosure have a contact coverage of less than 7%, such as less 4%. In some examples, the contact area of between the substrate and the substrate support 174 is about one fifth of conventional machines supports. This additionally results in a reduction in stress on the substrate support during manufacturing the substrate support 174.

While the discrete islands 215 are depicted as having a flat top surface 208, each individual discrete island 215 may generally have any suitable shape and height, each of which may be preferentially selected to fulfill particular design parameters (such as a desired gas flow and/or heat transfer).

FIGS. 4A-4C illustrate a partial cross sectional view of the substrate support 174 detailing a plurality of profiles for the discrete islands 215. The discrete islands 215 shown in FIGS. 4A-4C may have substantially the same width 424. For example, the discrete islands 215 may have a width 424 of less than about 5 mm. In FIGS. 4A-4C, each discrete island 215 has described a cross-sectional profile taken perpendicular to the substrate support surface 137 and extends through a center of the discrete island 215.

As shown in FIG. 4A, the discrete island 215 has a dome shape 410. The dome shape 410 may have a short flat portion 452 along an upper surface 415 of the discrete island 215. The flat portion 452 may be between 10% and 50% of the width 424. Thus, the dome shape 410 provides a minimal contact between the discrete island 215 and the substrate 124.

As shown in FIG. 4B, the discrete island 215 is cylindrical in shape. The discrete island 215 has a rectangular shaped cross-sectional profile 420. The rectangular shaped cross-sectional profile 420 is flat entirely along the upper surface 415 of the discrete island 215. Thus, the upper surface 415 is the same as the width 424. The rectangular shaped cross-sectional profile 420 increases contact between the discrete island 215 and the substrate 124, but is still less than that of conventional machined mesas.

As shown in FIG. 4C, the discrete island 215 is conical in shape. The discrete island 215 has a trapezoidal shaped cross-sectional profile 430. The trapezoidal shaped cross-sectional profile 430 is flat along the upper surface 415 of the discrete island 215. Thus, the upper surface 415 of the trapezoidal shaped cross-sectional profile 430 is less than the width 424. For example, the upper surface 415 of the trapezoidal shaped cross-sectional profile 430 may be between 90% and 60% that of the width 424. The trapezoidal shaped cross-sectional profile 430 has a smaller contact are than that of the rectangular shape 420

In one embodiment, the top surface 208 of the discrete islands 215 may be a flat planar surface. In other embodiments, the top surface 208 of the discrete islands 215 may form a non-planar surface, for example, a concave or convex surface. Generally, discrete islands 215 may have a discrete island height 262 of about 1 micron to about 100 microns, or more preferably between about 1 micron and 30 microns, such as about 15 microns to about 20 microns. In one embodiment, the surface of the discrete islands 215 that supports the substrate 124 may have a small rounded bump-like shape to minimize total contact area between the discrete islands 215 and the substrate 124. In another embodiment, discrete islands 215 may include a small bump or protrusion atop a generally flat surface.

Figure 5:
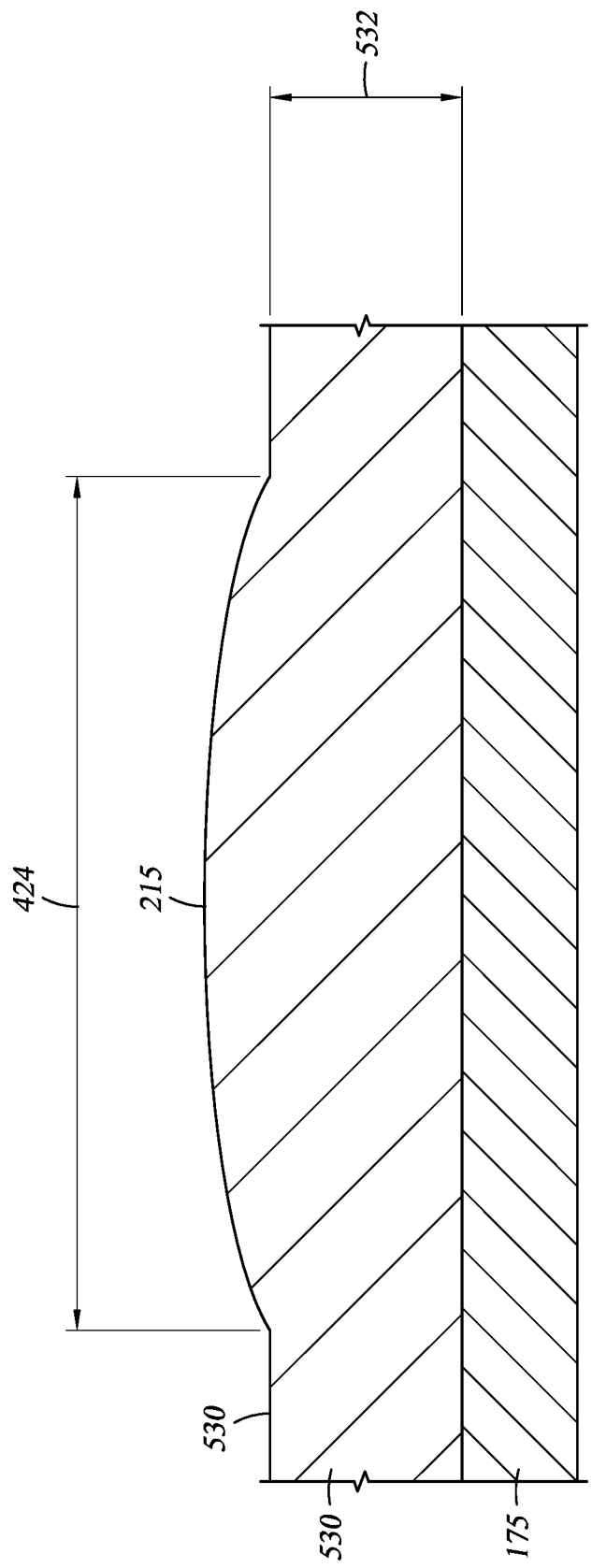
FIG. 5 is a cross sectional view of the discrete islands.

FIG. 5 is a cross sectional view of the discrete islands. The ceramic substrate support 174 may be formed from graphite, or other suitable material. In one example, the ceramic substrate support 174 may be SiC or other suitable material. A layer 530 may be formed in the pocket 354 on the substrate support surface 137. The layer 530 may be formed from SiC or other suitable material. The layer 530 contains the discrete islands 215. The discrete islands 215 are discretely formed across the pocket 354. The discrete islands 215 may be uniform in size and/or shape. The discrete islands 215 have an upper surface extending a height of between about 5 microns and about 40 microns, such as 20 microns, above the substrate support surface 137. The discrete islands 215 may be dome shaped. The discrete islands 215 may be formed with a diameter between about 2 mm and 4 mm such as about 3 mm. The discrete island 215 may be between about 10 microns to about 150 microns, such as less than about 50 microns high above the top surface 208 of the substrate support 174.

However, the discrete islands 215 do not cover the entire pocket 354 of the substrate support 174. For example, the discrete islands 215 may cover less than about 7%, such as about 3% of the pocket 354 of the substrate support 174.

Advantageously, the discrete islands 215 on the substrate support surface 137 of the substrate support 174 improves thermal uniformity for the substrates processed thereon the substrate support 174. The discrete island design with round top surface improves the thermal contact uniformity to wafer for Epi process. The lack of machining of substrate support surface 137 greatly reduces surface stress which lead to susceptor warpage. Reducing the substrate support surface machining provides further benefits for bot time as well as expenses. Warpage of the substrate support from the machining and SiC coating stress can therefore be reduced. The discrete islands 215 and trough 220 on the substrate support 174 provides improved support to substrate backside due to improved contact area for reducing the stress, and subsequent damage, to the substrate 124 and substrate support 174. Thus, the disclosed embodiments of the present invention provide a pattern of features for a substrate support assembly that are directed toward providing reduced particle generation and reduced wear of substrates and chucking devices.

While the foregoing is directed to embodiments of the invention, other and further embodiments of the invention may be devised without departing from the basic scope thereof.

What is claimed is:

1. A substrate support suitable for use in an epitaxial epitaxy processing chamber, the substrate support comprising:
   a susceptor body formed of a graphite material and having a center, an outer perimeter connecting a substrate support surface and a backside surface, the susceptor body consisting essentially of:
   a pocket disposed on the substrate support surface at a center of the substrate support surface;
   a lip disposed between the pocket and the outer perimeter, wherein the lip extends away from the backside surface and above the pocket; and
   a layer formed of a silicon carbide (SiC) material on the substrate support surface in the pocket, the layer comprising:
   a plurality of discrete islands formed of the silicon carbide (SiC) material, the plurality of discrete islands formed in less than about 7% of the pocket disposed on the substrate support surface, wherein the plurality of discrete islands are disposed concentrically about the center of the substrate support surface; and
   one or more troughs in the silicon carbide (SiC) material disposed between the plurality of discrete islands, wherein a first thickness from the substrate support surface of the silicon carbide (SiC) material at the plurality of discrete islands is greater than a second thickness from the substrate support surface of the silicon carbide (SiC) material at the troughs.

2. The substrate support of claim 1 wherein each discrete island of the plurality of discrete islands has a diameter of less than about 5 mm.

3. The substrate support of claim 2 wherein each discrete island of the plurality of discrete islands has a height above the substrate support surface about 50 microns or less at an island center.

4. The substrate support of claim 3 wherein each discrete island of the plurality of discrete islands comprises:
   a dome shaped cross-sectional profile taken perpendicular to the substrate support surface and extending through the island center.

5. The substrate support of claim 3 wherein each discrete island of the plurality of discrete islands comprises:
   a rectangular shaped cross-sectional profile taken perpendicular to the substrate support surface and extending through the island center.

6. The substrate support of claim 3 wherein each discrete island of the plurality of discrete islands comprises:
   a trapezoidal shaped cross-sectional profile taken perpendicular to the substrate support surface and extending through the island center.

7. An epitaxial processing chamber, comprising:
   a lid, walls and a bottom defining a processing volume;
   a substrate support disposed in the processing volume, the substrate support comprising:
   a susceptor body formed of a graphite material and having a center, an outer perimeter connecting a substrate support surface and a backside surface, the susceptor body consisting essentially of:
   a pocket disposed on the substrate support surface at a center of the substrate support surface;
   a lip disposed between the pocket and the outer perimeter, wherein the lip extends away from the backside surface and above the pocket;
   a layer formed of a silicon carbide (SiC) material on the substrate support surface in the pocket, the layer comprising:
   a plurality of discrete islands of the second material formed in less than about 7% of the pocket on the substrate support surface, wherein the plurality of discrete islands are disposed concentrically about the center of the substrate support surface; and
   one or more troughs in the silicon carbide (SiC) material disposed between the plurality of discrete islands, wherein a first thickness from the substrate support surface of the silicon carbide (SiC) material at the plurality of discrete islands is greater than a second thickness from the substrate support surface of the silicon carbide (SiC) material at the troughs; and a plurality of support pins disposed in the pocket, the plurality of support pins extending through the silicon carbide (SiC) material.

8. The epitaxial processing chamber of claim 7 wherein the plurality of discrete islands have a diameter of less than about 5 mm.

9. The epitaxial processing chamber of claim 8 wherein the plurality of discrete islands have a height above the substrate support surface of less than about 50 microns at an island center of each of the plurality of discrete islands.

10. The epitaxial processing chamber of claim 9 wherein each discrete island of the plurality of discrete islands comprises:
a dome shaped cross-sectional profile taken perpendicular to the substrate support surface and extending through the island center.

11. The epitaxial processing chamber of claim 9 wherein each discrete island of the plurality of discrete islands comprises:
a rectangular shaped cross-sectional profile taken perpendicular to the substrate support surface and extending through the island center.

12. The epitaxial processing chamber of claim 9 wherein each discrete island comprises:
a trapezoidal shaped cross-sectional profile taken perpendicular to the substrate support surface and extending through the island center.

* * * * *